(12) United States Patent
Hashitani

(10) Patent No.: US 8,716,142 B2
(45) Date of Patent: May 6, 2014

(54) SEMICONDUCTOR DEVICE AND METHOD OF MANUFACTURING THE SAME

(75) Inventor: Masayuki Hashitani, Chiba (JP)

(73) Assignee: Seiko Instruments Inc., Chiba (JP)

( * ) Notice: Subject to any disclaimer, the term of this patent is extended or adjusted under 35 U.S.C. 154(b) by 680 days.

(21) Appl. No.: 12/178,316

(22) Filed: Jul. 23, 2008

(65) Prior Publication Data

US 2009/0026537 A1 Jan. 29, 2009

(30) Foreign Application Priority Data

Jul. 27, 2007 (JP) .................................. 2007-195492

(51) Int. Cl.
*H01L 21/336* (2006.01)

(52) U.S. Cl.
USPC ............................ 438/720; 438/296; 257/330

(58) Field of Classification Search
USPC .................. 438/595, 244, 248, 254, 653, 305
See application file for complete search history.

(56) References Cited

U.S. PATENT DOCUMENTS

| | | | | |
|---|---|---|---|---|
| 6,066,533 A * | 5/2000 | Yu | ................................ | 438/275 |
| 6,329,258 B1 * | 12/2001 | Inaba | ............................ | 438/305 |
| 6,531,347 B1 * | 3/2003 | Huster et al. | ................... | 438/164 |
| 6,593,217 B1 * | 7/2003 | Fujisawa | ......................... | 438/495 |
| 6,956,263 B1 * | 10/2005 | Mistry | ............................ | 257/330 |
| 7,148,527 B2 * | 12/2006 | Kim et al. | ...................... | 257/288 |
| 7,242,058 B2 * | 7/2007 | Risaki | ............................ | 257/330 |
| 7,410,875 B2 * | 8/2008 | Ting et al. | ...................... | 438/300 |
| 7,492,035 B2 * | 2/2009 | Risaki | ............................ | 257/611 |
| 7,569,443 B2 * | 8/2009 | Kavalieros et al. | ............ | 438/183 |
| 7,666,742 B2 * | 2/2010 | Kim et al. | ...................... | 438/270 |
| 7,696,052 B2 * | 4/2010 | Wei et al. | ....................... | 438/300 |
| 7,719,062 B2 * | 5/2010 | Fischer et al. | ................. | 257/382 |
| 2005/0093060 A1 * | 5/2005 | Murakami | ..................... | 257/330 |
| 2006/0001085 A1 | 1/2006 | Risaki | | |
| 2006/0001110 A1 * | 1/2006 | Igarashi | ......................... | 257/401 |
| 2006/0011990 A1 * | 1/2006 | Furukawa et al. | ............. | 257/377 |
| 2006/0223253 A1 * | 10/2006 | Risaki | ............................ | 438/197 |
| 2007/0164364 A1 * | 7/2007 | Kawasaki | ...................... | 257/368 |
| 2008/0142839 A1 * | 6/2008 | Fukutome et al. | ............. | 257/190 |
| 2008/0185639 A1 * | 8/2008 | Risaki et al. | ................... | 257/330 |
| 2009/0189203 A1 * | 7/2009 | Matsuo | .......................... | 257/288 |

* cited by examiner

*Primary Examiner* — Steven Loke
*Assistant Examiner* — David Goodwin
(74) *Attorney, Agent, or Firm* — Brinks Gilson & Lione

(57) ABSTRACT

Provided is a semiconductor device formed with a trench portion for providing a concave portion in a gate width direction and with a gate electrode provided within and on a top surface of the trench portion via a gate insulating film. At least a part of a surface of each of the source region and the drain region is made lower than other parts of the surface by removing a thick oxide film formed in the vicinity of the gate electrode. Making lower the part of the surface of each of the source region and the drain region allows current flowing through a top surface of the concave portion of the gate electrode at high concentration to flow uniformly through the entire trench portion, which increase an effective gate width of the concave portion formed so as to have a varying depth in a gate width direction.

6 Claims, 5 Drawing Sheets

FIG. 4A
Prior Art
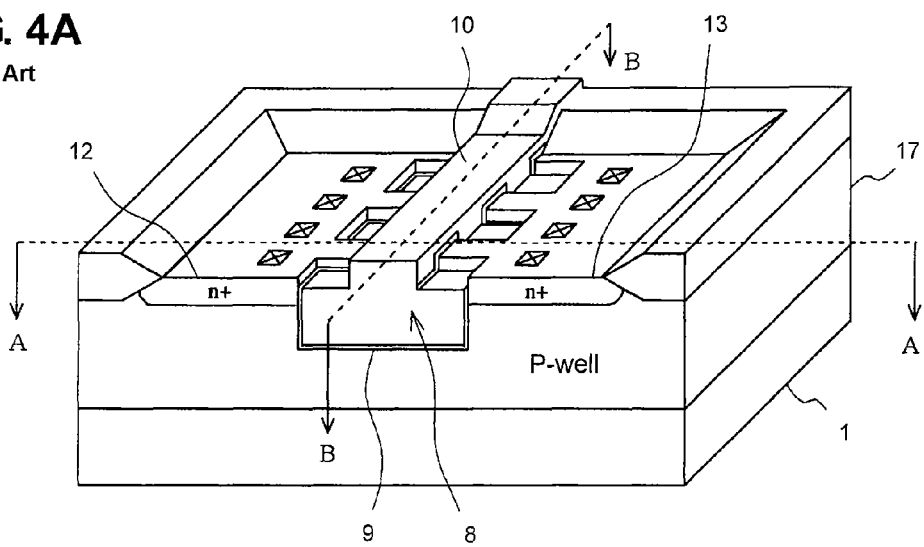
FIG. 4B
Prior Art
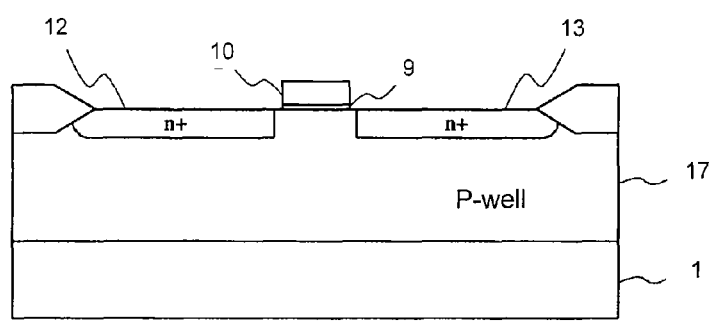
FIG. 4C
Prior Art
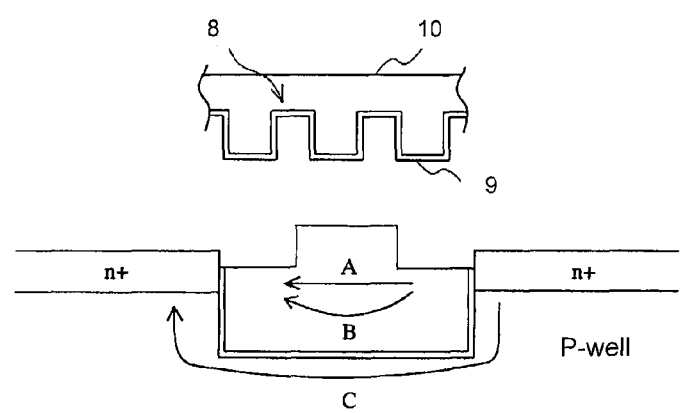
FIG. 4D
Prior Art

SEMICONDUCTOR DEVICE AND METHOD OF MANUFACTURING THE SAME

RELATED APPLICATIONS

This application claims priority under 35 U.S.C. §119 to Japanese Patent Application No. JP2007-195492 filed on Jul. 27, 2007, the entire content of which is hereby incorporated by reference.

BACKGROUND OF THE INVENTION

1. Field of the Invention

The present invention relates to a semiconductor device including a MOS transistor to which high driving performance is required, and relates to a method of manufacturing the semiconductor device.

2. Description of the Related Art

A MOS transistor is a core electronic element in electronics. It is important to achieve miniaturization of the MOS transistor and high driving performance thereof. One of methods of imparting high driving performance to the MOS transistor is expansion of a gate width to reduce ON resistance. However, there is a problem that a large gate width needs a wide occupation area for the MOS transistor. As a solution thereto, there is proposed a technology by which a large gate width is given while suppressing increase of the occupation area of the MOS transistor. (For example, see JP 2006-49826 A)

Hereinafter, a conventional semiconductor device will be described with reference to FIGS. 4A to 4D. As shown in a perspective view of FIG. 4A, the conventional semiconductor device includes a trench portion 8 provided in a well 17 and a gate electrode 10 provided in the trench portion 8 and on the top surface thereof on a gate insulating film 9. In a surface portion of the well 17, one side of the gate electrode 10 is provided with a source region 12 and the other side thereof is provided with a drain region 13. FIG. 4B is a sectional view of a planar portion taken along a cut surface A-A of FIG. 4A, and FIG. 4C is a sectional view taken along a cut surface B-B of FIG. 4A. As shown in FIG. 4C, since the gate electrode 10 is provided in the trench portion 8, a total length of the curve extending in the B-B direction of the gate electrode 10 brought into contact with the gate insulating film 9 gives a gate width.

As described above, since the gate portion has the trench structure including a convex portion and a concave portion, the actual gate width can be larger than the width of the gate electrode simply made on a flat surface thereof. Accordingly, the ON resistance per unit area can be reduced without lowering the withstanding voltage of the MOS transistor.

The inventor of the present invention has found a problem that in the structure of the semiconductor device described above, an actual driving performance can not reach the expected driving performance. It has also been found that the driving performance varies depending on the gate length and tends to be low in a short gate length device.

It is presumed that this phenomenon is caused by non-uniform current flow in the channel generated between the source and the drain: most current flows along path A which is a planar portion where the trench portion 8 is not formed; a little current flows along path B which is a side surface of the trench portion 8, which is parallel to the channel in the direction connecting the source and the drain, and along path C which is a bottom surface of the trench portion 8, as shown in FIG. 4D. Accordingly, the current tends to concentrate to the path A in the short gate length device, which is conceived to be a cause of the driving performance lowering in the short gate length device.

SUMMARY OF THE INVENTION

It is an object of the present invention to improve driving performance of a semiconductor device having a trench structure.

In order to solve the above-mentioned problems, the present invention employs the following means:

(1) a semiconductor device including: a first conductivity type semiconductor substrate; a trench portion formed on the first conductivity type semiconductor substrate and having a side surface and a bottom surface in a gate width direction; a gate electrode formed within the trench portion and on a top surface of a planar portion via a gate insulating film; a source region of a second conductivity type, formed on one side of the gate electrode; and a drain region of the second conductivity type, formed on another side of the gate electrode, in which the source region and the drain region include at least one part of a surface thereof in a vicinity of the gate electrode, the part being arranged in a lower position than other parts of the surface, and have a diffusion depth deeper in a downward portion of the part of the surface arranged at the lower position than downward portions of the other parts of the surface;

(2) a semiconductor device including: a first conductivity type semiconductor substrate; a source region of a second conductivity type and a drain region of the second conductivity type, which are disposed apart from each other in a vicinity of a surface of the first conductivity type semiconductor substrate; a planar portion being flat and disposed between the source region and the drain region to become a first channel region; a trench portion with a constant depth, disposed along with the planar portion and having a side surface and a bottom surface serving as a second channel region; a gate insulating film provided on a surface of the planar portion and a surface of the trench portion; and a gate electrode provided on the gate insulating film, in which the source region and the drain region include on a surface thereof a part facing a part of another side via the trench portion, which is arranged in a lower position than other parts of the surface, and have a diffusion depth deeper in the part facing the part of the another side via the trench portion than the other parts of the surface; and (3) a method of manufacturing a semiconductor device, including: preparing a semiconductor substrate of a first conductivity type; removing a part of a region to become a source region and a part of a region to become a drain region from a surface of the semiconductor substrate to form a concave portion; forming a trench having a side surface and a bottom surface in a region to become a channel to arrange a planar portion and a trench portion; forming a gate insulating film on a side surface and a bottom surface of the trench portion and on a surface of the planar portion; forming a gate electrode on the gate insulating film; and forming the source region of a second conductivity type and the drain region of the second conductivity type to sandwich the gate electrode therebetween around the concave portion.

According to the present invention, a part of the surface of the source region and the drain region of the semiconductor device described above can be lower than other parts of the surface by removing a thick oxide film formed by LOCOS method at least in a part of the vicinity of the gate electrode. Since formation of the source region and the drain region to a deeper position with respect to the gate electrode of the trench portion of the transistor is enabled, concentration of the current at the top of the concave portion in the gate width direction can accordingly be reduced, and the current flow can be dispersed to the inside of the concave portion to flow along a deep path, which can enhance the driving performance of the semiconductor device.

BRIEF DESCRIPTION OF THE DRAWINGS

In the accompanying drawings:

FIG. 4A is a perspective view, FIGS. 4B and 4C are sectional views, each showing a MOS transistor having a trench structure of a conventional art, and FIG. 4D is a schematic view showing paths of current flowing through a channel of the MOS transistor having the trench structure of the related art.

DETAILED DESCRIPTION OF THE PREFERRED EMBODIMENTS

Hereinafter, embodiments of the present invention will be described with reference to the drawings.

Figure 1A:
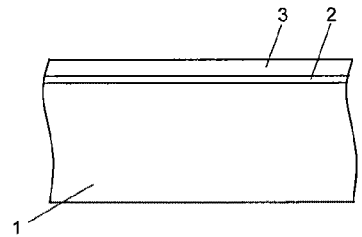
FIGS. 1A to 1J are schematic sectional views of a process sequence flow showing a method of manufacturing a semiconductor device according to a first embodiment of the present invention.
Figure 1B:
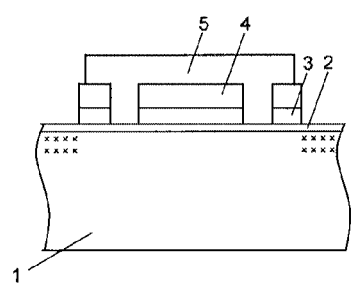

FIGS. 1A to 1J are schematic sectional views along a process sequence flow showing a method of manufacturing a semiconductor device according to a first embodiment of the present invention. In FIG. 1A, on a first conductivity type semiconductor substrate, for example, a p-type semiconductor substrate 1, or a semiconductor substrate having an impurity concentration of a resistivity ranging from 20 Ωcm to 30 Ωcm due to addition of boron, a oxide film 2 such as a thermal oxide film having a thickness of several hundred Å is formed. After that, a nitride film 3 is formed, for example, in a thickness of several thousand Å. Note that the substrate of this embodiment has the p-type conductivity, but the conductivity of the substrate is not related to the essence of the present invention. As shown in FIG. 1B, patterning is performed on the nitride film 3 with a resist film 4 and the nitride film 3 is removed by local oxidation of silicon (LOCOS) method to form an oxide film. The nitride film of this case is used to form a thick oxide film by the LOCOS method in a subsequent process. After that, a resist film 5 is formed while the resist film 4 is held, and an impurity is added to form a low-concentration diffusion layer in a channel cut region. For example, phosphorus is ion-implanted preferably at a dosage of $1\times10^{11}$ atoms/cm$^2$ to $1\times10^{13}$ atoms/cm$^2$. In this case, arsenic can be used as an impurity.

Figure 1C:
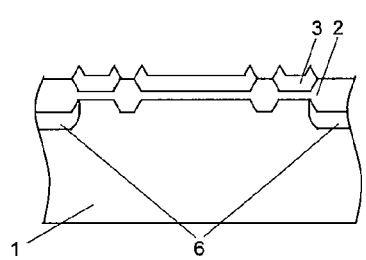
Figure 1D:
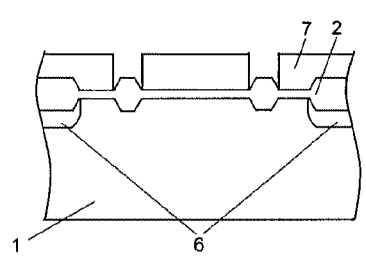
Figure 1E:
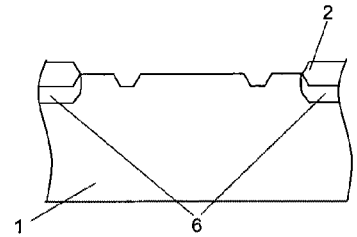
Figure 1F:
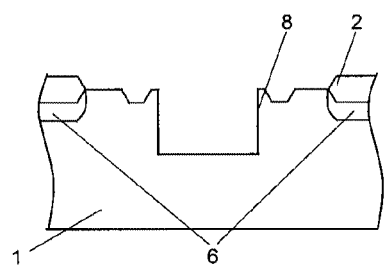

Then, as shown in FIG. 1C, the resist films 4 and 5 are removed and a LOCOS oxide film is formed by the LOCOS method. In this case, the oxide film is grown by thermal oxidation at a temperature of 1,000 to 1,200° C. for several hours to have, for example, a thickness of 500 nm to 1 μm. At the same time, the low-concentration diffusion layer 6 in the channel cut region is formed. Subsequently, as shown in FIG. 1D, after removal of the nitride film 3, patterning is performed with a resist film 7 to remove the LOCOS oxide film. Instead of the resist film 7, a film of nitride or polycrystalline silicon may be used as a mask for patterning. After removal of the resist film 7 and the oxide film 2, the structure shown in FIG. 1E is then obtained. The structure has concave portions which make portions of a surface of a region which is to be a source region or a drain region lower than other portions thereof. Subsequently, as shown in FIG. 1F, a trench structure 8 is formed in the first conductivity type semiconductor substrate, for example, at a depth of several hundred nm to several μm.

Figure 1G:
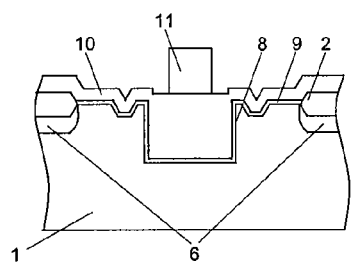
Figure 1H:
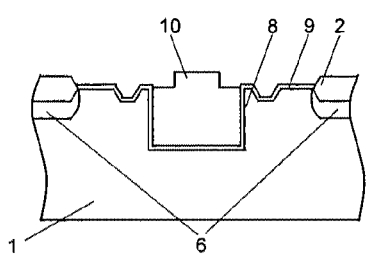

As shown in FIG. 1G, after a gate insulating film 9 such as a thermal oxidation film is formed in a thickness of several hundred to several thousand Å, a polycrystalline silicon gate film is deposited on the gate insulating film 9 preferably in a thickness of 100 nm to 500 nm, and an impurity is introduced by predeposition or ion implantation to lower the resistivity to obtain a gate electrode 10. In this case, the conductivity may be the first conductivity type or a second conductivity type. Further, the gate electrode 10 is patterned with a resist film 11, which provides a structure as shown in FIG. 1H. As described above, a region to be a channel of the MOS transistor is substantially determined. FIG. 1H shows only a region to be a channel of the trench portion, but a region to be a channel of the planar portion is also formed by patterning on the gate electrode 10 simultaneously.

Figure 1I:
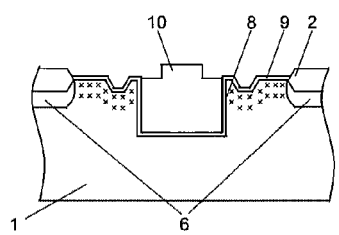
Figure 1J:
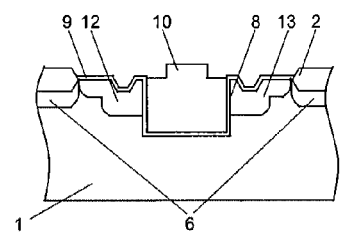

Subsequently, as shown in FIG. 1I, an impurity is added to form a source region and a drain region in a self-alignment manner. In the impurity addition to the source region and the drain region, for example, arsenic is ion-implanted preferably at a dosage of $1\times10^{15}$ atoms/cm$^2$ to $1\times10^{16}$ atoms/cm$^2$. Further, the introduction of the impurity to the source region and the drain region can be simultaneously performed under the same conditions as the conditions for the MOS transistor which does not have the trench structure 8 in the same chip. Through the above-mentioned processes, the MOS transistor having the trench structure 8 is configured. As shown in FIG. 1J, heat treatment at the temperature of 800° C. to 1,000° C. for several hours, then, forms a source region 12 and a drain region 13. In this embodiment, the source region 12 and the drain region 13 in the vicinity of the gate electrode 10 have a lowered portion on a part of the surface thereof. Accordingly, the impurity for forming the source region 12 and the drain region 13 is also distributed to a deeper portion than before, permitting an amount of current flow through the side surface of the trench portion or the bottom surface thereof to increase.

The structure of the MOS transistor having the trench structure, which is manufactured by the method including the above-mentioned processes, will be described in more detail with reference to FIGS. 2A to 2C.

Figure 2A:
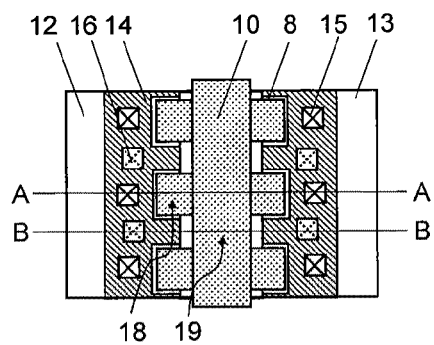
FIG. 2A is a plan view and FIGS. 2B and 2C are sectional views showing a detail of a MOS transistor having a trench structure according to the first embodiment of the present invention.
Figure 2B:
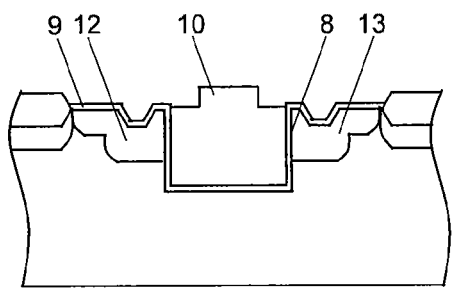
Figure 2C:
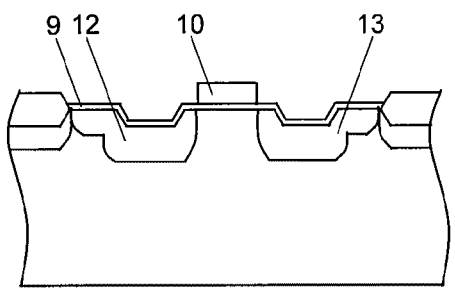

FIG. 2A is a plan view of the MOS transistor of the first embodiment of the present invention, FIG. 2B is a sectional view taken along the line A-A of FIG. 2A, and FIG. 2C is a sectional view taken along the line B-B of FIG. 2A.

The semiconductor device of the present invention has both the gate electrode consisting of the plural trench portions 8 which are arranged in a gate width direction, and the gate electrode formed on the planar portion constituting a part of the channel region except the trench portion. FIG. 2B is a sectional view taken along the line A-A of FIG. 2A, and shows a trench portion transistor 18. FIG. 2C is a sectional view taken along the line B-B of FIG. 2A, and shows a planar portion transistor 19. FIG. 2A shows the gate insulating film 9 which is provided so as to follow the shape of the trench portion under the gate electrode 10.

FIG. 2A shows a first embodiment of the present invention in which regions 14, from which thick oxide film made by the LOCOS method has been removed to make at least a part of the surface of the source region 12 and the drain region 13 in the vicinity of the gate electrode 10 lower than other portions, exist continuously and collectively in the source region 12 and the drain region 13, and are disposed to surround both ends in a gate length direction of the gate electrode 10 of the trench portion transistor 18.

Further, in this embodiment, a trench portion contact 15 and a planar portion contact 16 which serve as wiring contacts are arranged on the lowered portions on the surface in the vicinity of the gate electrode 10, which are in the source region 12 and the drain region 13.

Figure 3:
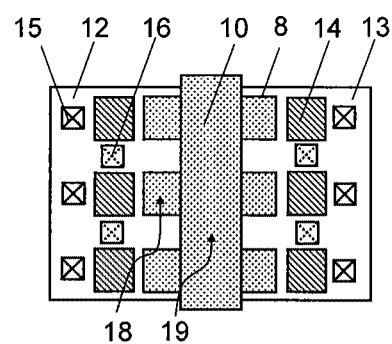
FIG. 3 is a plan view showing the detail of a MOS transistor having a trench structure according to a second embodiment of the present invention.

FIG. 3 is a plan view showing a semiconductor device according to a second embodiment of the present invention. In FIG. 3, the thick oxide film removed region 14 has at least a part on the surface of the source region 12 and the drain region 13, which is lower than other portions, and is selectively formed on an extension of the gate length direction of the gate electrode 10 of the trench portion transistor 18. Along with this, for the wiring contacts, the trench portion contact 15 or the planar portion contact 16 is arranged in a different position. For example, the planar portion contact 16 is disposed at a smaller distance to the gate electrode 10 than the trench portion contact 15 for the purpose of reducing parasitic resistance. Also in FIG. 3, the gate insulating film 9 is provided so as to follow the shape of the trench portion under the gate electrode 10.

What is claimed is:

1. A method of manufacturing a semiconductor device, comprising:
    preparing a semiconductor substrate of a first conductivity type;
    removing a portion from a surface of the semiconductor substrate to form a concave surface region;
    forming trenches having a side surface and a bottom surface in a region to become a channel, such that the semiconductor substrate surface has a planar portion and trench portions, wherein the trenches are spaced away from the concave surface region along the surface by a constant distance, such that the concave surface region follows a contour of the side surface of the trenches;
    forming a gate insulating film on the side surface and the bottom surface of the trenches and on the surface of the planar portion;
    forming a gate electrode on the gate insulating film, such that the gate electrode extends farther in a channel length direction in the trench portions than in the planar portion; and
    forming a source region of a second conductivity type and a drain region of the second conductivity type in the substrate below the concave surface region, such that the source and drain regions are adjacent to the side surfaces of the trenches and sandwich the gate electrode therebetween below the concave surface region.

2. A method of manufacturing a semiconductor device according to claim 1, wherein removing a portion from a surface of the semiconductor substrate to form a concave surface region comprises forming a thick oxide film by using a LOCOS method and removing the thick oxide film.

3. A method of manufacturing a semiconductor device according to claim 1, wherein forming the source region of a second conductivity type and the drain region of the second conductivity type further comprises introducing an impurity under the same condition as a condition of an impurity introduction to a source region and a drain region of another transistor formed on the same semiconductor substrate.

4. A method of manufacturing a semiconductor device according to claim 1, wherein forming the source region of a second conductivity type and the drain region of the second conductivity type further comprises introducing an impurity simultaneously with an impurity introduction to a source region and a drain region of another transistor formed on the same semiconductor substrate.

5. A method of manufacturing a semiconductor device according to claim 1 further comprising forming first electrical contacts to the source and drain regions in proximity to the trenches and second electrical contacts to the source and drain regions in the planar portion.

6. A method of manufacturing a semiconductor device comprising:
    providing a substrate having an active surface region;
    forming linear recesses in the active surface region;
    forming a series of trenches in the active surface region intermediate to the linear recesses and spaced apart therefrom and leaving a planar portion of the active surface region between the trenches, the trenches having side surfaces,
    wherein the linear recesses are separated from the side surfaces of the trenches by a constant distance, such that the linear recesses follow a contour of the side surfaces of the trench;
    forming a gate insulating film on a side surface and a bottom surface of the trenches and on the planar portion of the active surface region;
    forming a gate electrode on the gate insulating film that fills the trenches and extends on the planar portion of the active surface region and is separated from the linear recesses,
    wherein the gate electrode extends farther in a channel length direction in the trenches than on the planar portion of active surface region; and
    forming source and drain regions in the substrate below the linear recesses, such that the source and drain regions are adjacent to side surfaces of the trenches.

\* \* \* \* \*